United States Patent
Thomas et al.

(10) Patent No.: US 8,163,645 B2
(45) Date of Patent: Apr. 24, 2012

(54) METHOD FOR PROVIDING A REDISTRIBUTION METAL LAYER IN AN INTEGRATED CIRCUIT

(75) Inventors: Danielle A. Thomas, Dallas, TX (US); Harry Michael Siegel, Hurst, TX (US); Antonio A. Do Bento Vieira, Carrollton, TX (US); Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 45 days.

(21) Appl. No.: 12/804,870

(22) Filed: Jul. 30, 2010

(65) Prior Publication Data
US 2010/0297841 A1 Nov. 25, 2010

Related U.S. Application Data

(62) Division of application No. 11/455,503, filed on Jun. 19, 2006, now Pat. No. 7,786,582, which is a division of application No. 10/091,743, filed on Mar. 6, 2002, now Pat. No. 7,096,581.

(51) Int. Cl.
*H01L 21/4763* (2006.01)
*H01L 21/44* (2006.01)

(52) U.S. Cl. ........ 438/618; 438/612; 438/622; 438/666; 257/E21.508

(58) Field of Classification Search .......... 438/618, 438/612, 622, 666; 257/E21.508
See application file for complete search history.

(56) References Cited

U.S. PATENT DOCUMENTS

| | | |
|---|---|---|
| 4,723,197 A | 2/1988 | Takiar et al. |
| 4,990,464 A | 2/1991 | Baumgart et al. |
| 5,306,936 A | 4/1994 | Goto |
| 6,025,277 A | 2/2000 | Chen et al. |
| 6,037,664 A | 3/2000 | Zhao et al. |
| 6,165,891 A | 12/2000 | Chooi et al. |
| 6,180,445 B1 | 1/2001 | Tsai |
| 6,218,302 B1 * | 4/2001 | Braeckelmann et al. ..... 438/687 |
| 6,232,662 B1 | 5/2001 | Saran |
| 6,262,438 B1 | 7/2001 | Yamazaki et al. |
| 6,380,555 B1 * | 4/2002 | Hembree et al. ................ 257/48 |
| 6,396,148 B1 | 5/2002 | Eichelberger et al. |
| 6,407,002 B1 | 6/2002 | Lin et al. |
| 6,441,467 B2 | 8/2002 | Toyosawa et al. |
| 6,551,856 B1 | 4/2003 | Lee |
| 6,657,310 B2 | 12/2003 | Lin |
| 6,746,898 B2 * | 6/2004 | Lin et al. ....................... 438/113 |
| 6,965,165 B2 | 11/2005 | Lin |
| 7,446,028 B2 * | 11/2008 | Hiatt et al. .................... 438/612 |
| 2001/0051426 A1 | 12/2001 | Pozder et al. |
| 2002/0115282 A1 * | 8/2002 | Lin et al. ....................... 438/622 |
| 2003/0124835 A1 * | 7/2003 | Lin et al. ....................... 438/622 |
| 2003/0205804 A1 * | 11/2003 | Lee et al. ...................... 257/703 |

FOREIGN PATENT DOCUMENTS

| | | |
|---|---|---|
| GB | 2 364 170 | 1/2002 |
| WO | WO 02/03456 A2 | 1/2002 |

* cited by examiner

*Primary Examiner* — Nitin Parekh

(57) ABSTRACT

A system and method is disclosed for providing a redistribution metal layer in an integrated circuit. The redistribution metal layer is formed from the last metal layer in the integrated circuit during manufacture of the integrated circuit before final passivation is applied. The last metal layer provides sites for solder bump pads used in flip chip interconnection. The redistribution metal layer can be (1) a flat layer deposited over the next to last metal layer through an opening in a dielectric layer, or (2) deposited over an array of vias connected to the next to last metal layer. Space between the solder bump pads is deposited with narrower traces for connecting active circuit areas below. A final passivation layer is deposited to ensure product reliability.

20 Claims, 9 Drawing Sheets

METHOD FOR PROVIDING A REDISTRIBUTION METAL LAYER IN AN INTEGRATED CIRCUIT

This application is a division of prior U.S. patent application Ser. No. 11/455,503 filed Jun. 19, 2006, now U.S. Pat. No. 7,786,582, which is a division of prior U.S. patent application Ser. No. 10/091,743 filed Mar. 6, 2002, now U.S. Pat. No. 7,096,581.

TECHNICAL FIELD OF THE INVENTION

The present invention is directed, in general, to integrated circuits and, more specifically, to a system and method for providing a redistribution metal layer in an integrated circuit.

BACKGROUND OF THE INVENTION

Microelectronic devices often use solder projections (also referred to as bumps) in order to establish an electrical connection to other microelectronic devices. In a flip chip connection type integrated circuit, solder bumps are formed on the input/output (I/O) pads, on the test pads, on the power pads, and on the ground pads of an integrated circuit chip. The input/output (I/O) pads, the test pads, the power pads, and the ground pads are collectively referred to as "bump pads." The face of the chip with the solder bumps is then placed in contact with a printed circuit board so that the solder bumps are aligned with corresponding solder pads on the printed circuit board. Heat is applied to melt the solder bumps and form an electrical connection between the bump pads of the chip and the solder pads of the printed circuit board.

It is often necessary to place a solder bump at a location on a chip that is not located directly over a corresponding underlying circuit. This is accomplished by adding additional layers to the chip (1) to provide an electrical connection between the solder bump and a corresponding metal pad, and (2) to provide an additional passivation layer to insulate the electrical connection between the solder bump and the corresponding metal pad. This process is generally referred to as "redistribution." The electrical connection usually comprises a metal layer referred to as a "redistribution metal layer."

FIG. 1 illustrates a portion of a typical prior art integrated circuit chip 100 showing solder bump 120 attached to and electrically connected to an "under bump metallurgy" (UBM) layer 130. UBM layer 130 forms a bump pad on which solder bump 120 is deposited. UBM layer 130 is attached to and electrically connected to redistribution metal layer 140. Redistribution metal layer 140 extends from UBM layer 130 to metal pad 150. Metal pad 150 is used for wire bonding in some cases. Metal pad 150 can also be used as an intermediate connecting pad between an active circuit area and a solder bump pad.

Redistribution metal layer 140 is attached to and electrically connected to metal pad 150. Metal pad 150 is mounted on silicon layer 160. Active circuits 170 are also mounted on silicon layer 160. A primary passivation layer 180 is applied to cover silicon layer 160 and active circuits 170. A secondary passivation layer 190 is applied to cover redistribution metal layer 140 and primary passivation layer 180.

When integrated circuit chip 100 is manufactured, silicon layer 160 is manufactured first. Then the active circuits 170 are added. Next metal pad 150 is placed on silicon layer 160. Then primary passivation layer 180 is applied to cover silicon layer 160 and metal pad 150 and active circuits 170. Primary passivation layer 180 is then etched to uncover a portion of metal pad 150.

At this stage the fabrication of the basic functional chip is complete. The next stage is to provide "redistribution" by adding redistribution metal layer 140, secondary passivation layer 190, and UBM layer 130. It is common practice to fabricate integrated circuit chip 100 in two stages. In the first stage, the basic functional chip is fabricated. In the second stage, the "redistribution" process is performed.

The "redistribution" process is sometimes not performed at the facility where the basic functional chip was fabricated. The "redistribution" process is sometimes subcontracted out to be performed at some other facility. In some instances the quality of the "redistribution" process performed at a subcontractor's facility may not be sufficiently high to qualify the basic functional chip for high reliability applications.

There is therefore a need in the art for an improved system and method for providing a high quality "redistribution" process for an integrated circuit chip. There is also a need in the art for providing a high quality redistribution metal layer in an integrated circuit chip.

SUMMARY OF THE INVENTION

To address the deficiencies of the prior art, it is a primary object of the present invention to provide an improved system and method for providing a redistribution metal layer in an integrated circuit chip.

The present invention generally comprises an improved system and method for manufacturing an integrated circuit. In one advantageous embodiment of the present invention an integrated circuit is fabricated by forming an active circuit area and an associated metal pad on a base substrate. A passivation layer is then deposited on the active circuit area and on the metal pad. Vias are then etched through the passivation layer down to the metal pad. A patterned metal layer is then deposited onto the passivation layer. This forms a redistribution metal layer. The vias are simultaneously filled with metal when the redistribution metal layer is deposited. The vias electrically connect the redistribution metal layer to the metal pad. The redistribution metal layer is then polished to provide a suitably flat surface that is open to receive a solder bump.

It is an object of the present invention to provide an improved system and method for providing a high quality "redistribution" process for an integrated circuit chip.

It is also an object of the present invention to provide an improved system and method for providing a redistribution metal layer in an integrated circuit chip.

It is another object of the present invention to provide an improved system and method for providing a redistribution metal layer in an integrated circuit chip that possesses the same quality of manufacturing as other metal layers in the integrated circuit chip.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit.

The system and method of the present invention provides a high quality redistribution metal layer in an integrated circuit chip by fabricating the redistribution metal layer during the original fabrication of the basic functional chip.

Figure 1:
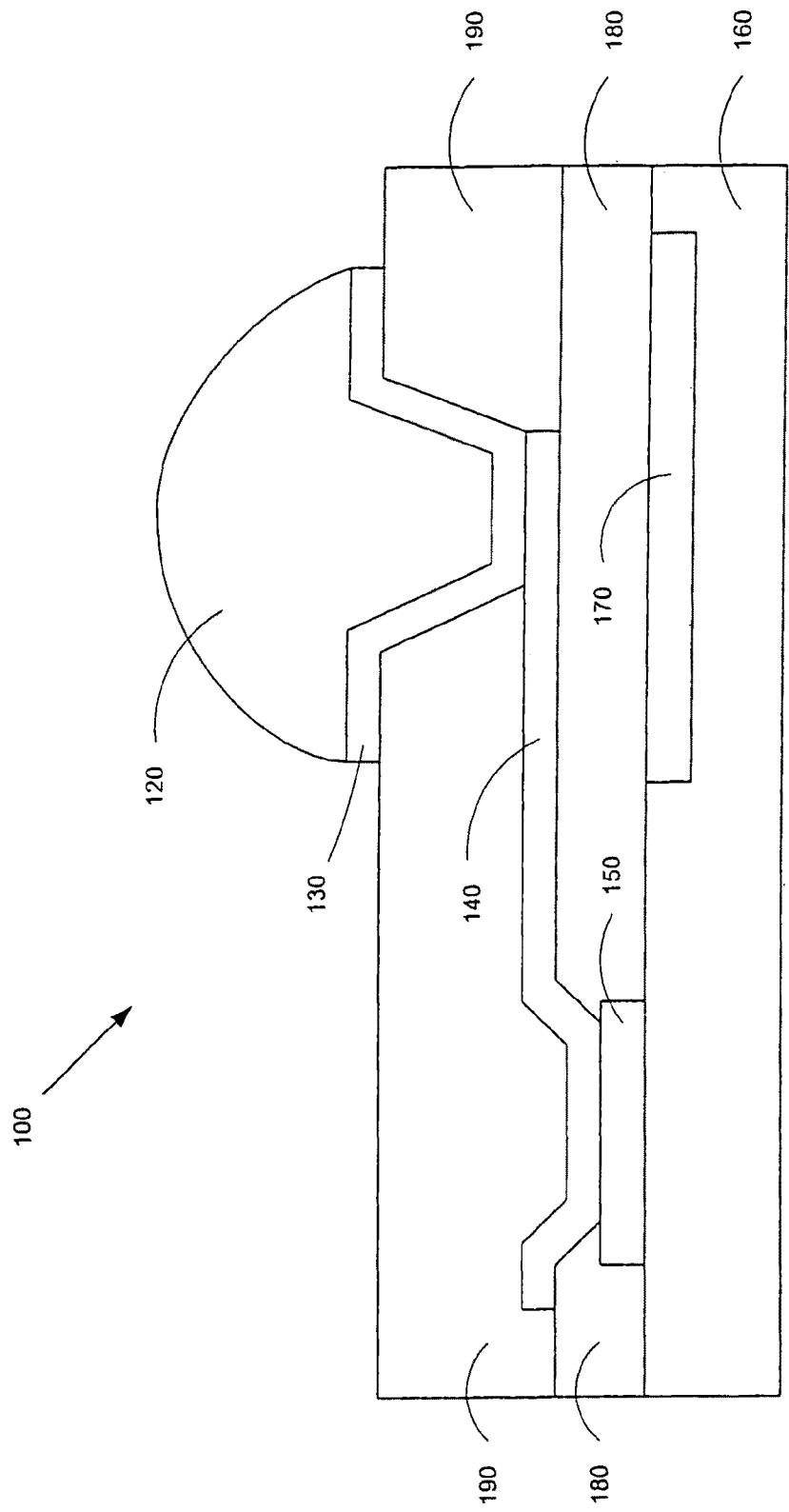
FIG. 1 illustrates a portion of a typical prior art integrated circuit chip that has been fabricated by making a basic functional chip and then performing a prior art "redistribution" process to add a redistribution metal layer, a secondary passivation layer, a UBM layer, and a solder bump to the basic functional chip.

FIG. 1 illustrates a portion of a typical prior art integrated circuit chip 100. The features of prior art integrated circuit chip 100 have been previously discussed.

Figure 2:
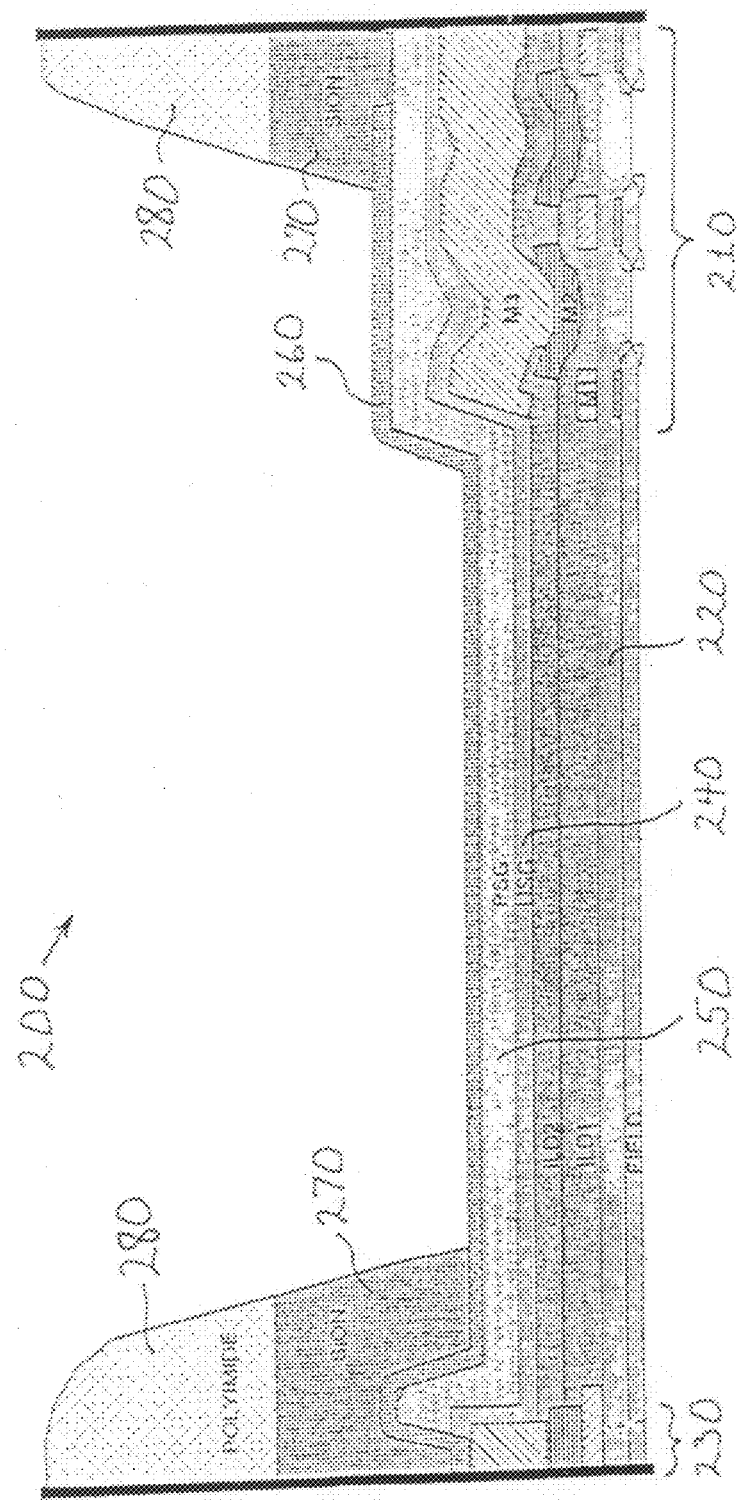
FIG. 2 illustrates an advantageous embodiment of an integrated circuit chip of the present invention.

FIG. 2 illustrates an advantageous embodiment of an integrated circuit chip 200 of the present invention. Active circuit area 210 of integrated circuit chip 200 is fabricated by sequentially depositing layers of three metals (represented by the letters M1, M2 and M3) on a base substrate 220. An associated metal pad 230 is also fabricated as shown in FIG. 2. Active circuit area 210 and metal pad 230 are covered with layer 240 of undoped silicon oxide (USG). USG layer 240 is then covered with a layer 250 of phosphorus doped silicon oxide (PSG).

Redistribution metal layer 260 is then placed over PSG layer 250 as shown in FIG. 2. A first end portion of redistribution metal layer 260 is then electrically connected to metal pad 230. In one advantageous embodiment the metal in redistribution metal layer 260 is aluminum. In another advantageous embodiment the metal in redistribution metal layer 260 is tungsten. Other types of metals may also be used.

A layer 270 of silicon oxynitride (SiON) is then deposited over redistribution metal layer 260. A layer 280 of polyimide is then deposited over silicon oxynitride (SiON) layer 270. Portions of polyimide layer 280 and silicon oxynitride (SiON) layer 270 are then etched to fit a desired pattern that leaves portions of redistribution metal layer 260 uncovered. Redistribution metal layer 260 follows the underlying contours of the phosphorus doped silicon oxide (PSG) layer 250. A substantial portion of redistribution metal layer 250 may be flat to receive a solder bump.

Integrated circuit chip 200 of the present invention therefore comprises redistribution metal layer 260 having a first portion in electrical contact with metal pad 230 and having a flat second portion open to receive a solder bump (solder bump not shown in FIG. 2). The quality of fabrication of redistribution metal layer 260 is of the same high quality as the other metal layers of integrated circuit chip 200. The structure of integrated circuit chip 200 comprising redistribution metal layer 260 may be achieved with only two additional process steps. The system and method of the present invention therefore provides a low cost simplified method for fabricating a redistribution metal layer in an integrated circuit chip.

Figure 3:
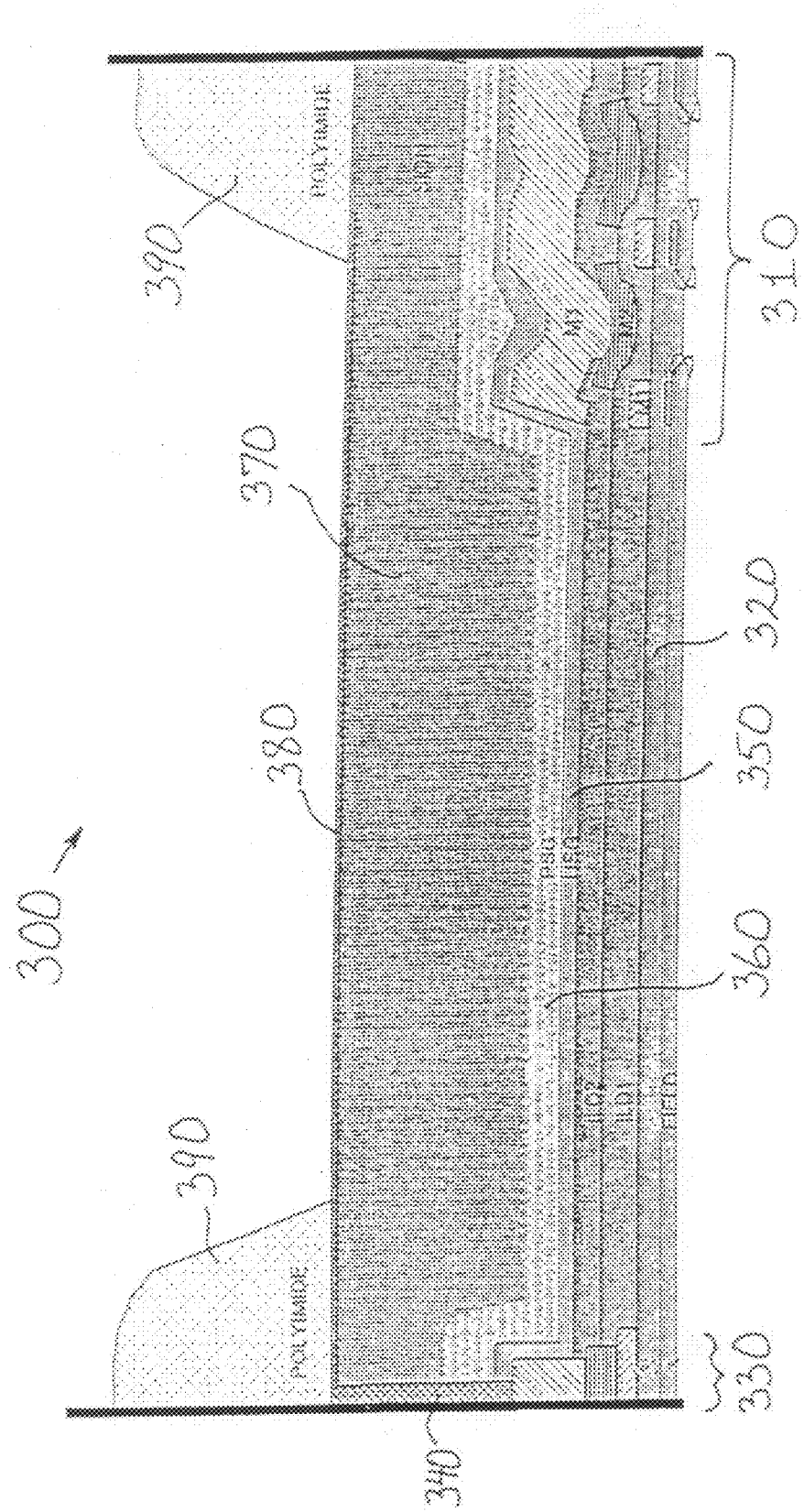
FIG. 3 illustrates another advantageous embodiment of an integrated circuit chip of the present invention.

FIG. 3 illustrates an alternate advantageous embodiment of an integrated circuit chip 300 of the present invention. Active circuit area 310 of integrated circuit chip 300 is fabricated by sequentially depositing layers of three metals (represented by the letters M1, M2 and M3) on a base substrate 320. An associated metal pad 330 is also fabricated as shown in FIG. 3. Plug 340 of redistribution metal layer is mounted on and electrically connected to metal pad 330. Plug 340 of redistribution metal layer extends upwardly from metal pad 330 as shown in FIG. 3.

Active circuit area 310 and metal pad 330 are covered with layer 350 of undoped silicon oxide (USG). USG layer 350 is then covered with a layer 360 of phosphorus doped silicon oxide (PSG). A layer 370 of silicon oxynitride (SiON) is then deposited over PSG layer 360.

A layer 380 of redistribution metal layer is then deposited over layer 370 of silicon oxynitride (SiON). Layer 380 of redistribution metal layer is electrically connected to the top of plug 340 of redistribution metal layer. In this manner plug 340 and layer 380 form a continuous electrical path from metal pad 330 to the surface of layer 380. In one advantageous embodiment the metal in redistribution metal layer 380 is aluminum. In another advantageous embodiment the metal in redistribution metal layer 380 is tungsten. Other types of metals may also be used.

Lastly, a polyimide layer 390 is deposited over portions of redistribution metal layer 380 and over portions of silicon oxynitride (SiON) layer 370. Portions of polyimide layer 390 are then etched to fit a desired pattern that leaves portions of redistribution metal layer 380 uncovered. Redistribution metal layer 380 follows the underlying contours of the silicon oxynitride (SiON) layer 370. As shown in FIG. 3, a substantial portion of silicon oxynitride (SiON) layer 370 and redistribution metal layer 380 may be flat to receive a solder bump. The planar surfaces of the silicon oxynitride (SiON) layer 370 and of the redistribution metal layer 380 may be fabricated by polishing the surfaces with chemical mechanical polishing (CMP) after metal deposition and patterning.

Integrated circuit chip 300 of the present invention therefore comprises a redistribution metal layer comprising a redistribution metal layer plug 340 and a redistribution metal layer 380. The redistribution metal layer of this embodiment of the invention comprises a first portion in electrical contact with metal pad 330 (i.e., plug 340) and a second portion (i.e., layer 380) open to receive a solder bump (solder bump not shown in FIG. 3). The quality of fabrication of the combination of plug 340 and layer 380 of the redistribution metal layer is of the same high quality as the other metal layers of integrated circuit chip 300.

The planar structure of redistribution metal layer 380 within integrated circuit chip 300 offers an advantageous environment for the placement of "under bump metallurgy" and for the placement of a solder bump. The planar structure of redistribution metal layer 380 within integrated circuit chip 300 also makes possible the use of simplified "under bump metallurgy" of copper damascene. The system and method of the present invention therefore provides a low cost simplified method for fabricating a planar structure of a redistribution metal layer in an integrated circuit chip.

Figure 4:
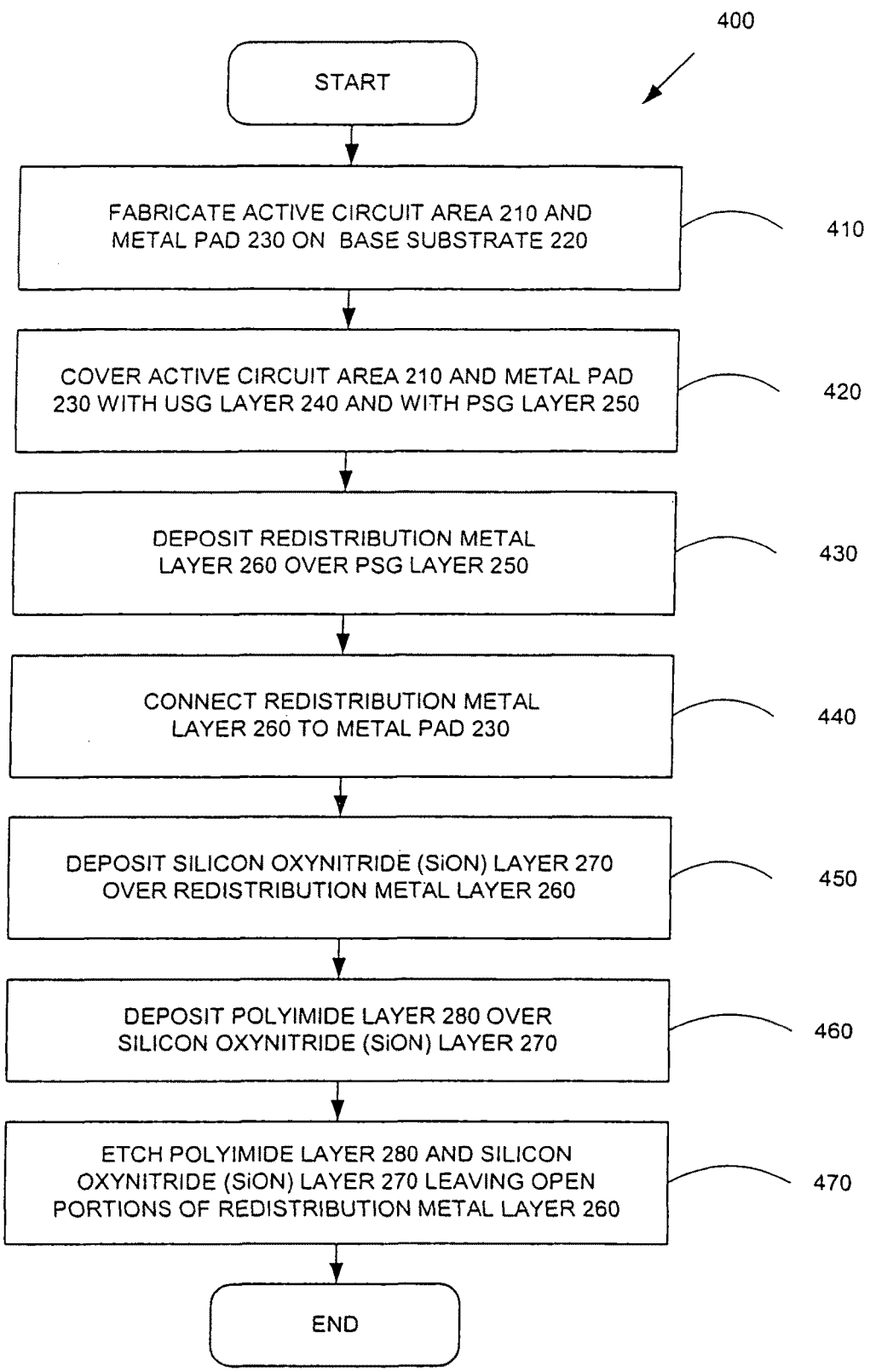
FIG. 4 illustrates a flow chart of an advantageous embodiment of a method of the present invention for providing a redistribution metal layer in an integrated circuit chip.

FIG. 4 illustrates a flow chart of an advantageous embodiment of a method of the present invention for providing a redistribution metal layer in an integrated circuit chip. The steps of the method are generally denoted with reference numeral 400.

The first step is to fabricate an active circuit area 210 and an associated metal pad 230 on a base substrate 220 (step 410). Then active circuit area 210 and metal pad 230 are covered with USG layer 240 and USG layer 240 is covered with PSG layer 250 (step 420). Then redistribution metal layer 260 is deposited over PSG layer 250 (step 430).

Redistribution metal layer 260 is electrically connected to metal pad 230 (step 440). Silicon oxynitride (SiON) layer 270 is then deposited over redistribution metal layer 260 (step 450). Polyimide layer 280 is then deposited over silicon oxynitride (SiON) layer 270 (step 460). Lastly, portions of polyimide layer 280 and silicon oxynitride (SiON) layer 270 are etched to fit a desired pattern that leaves portions of redistribution metal layer 380 uncovered to receive a solder bump (step 470).

Figure 5:
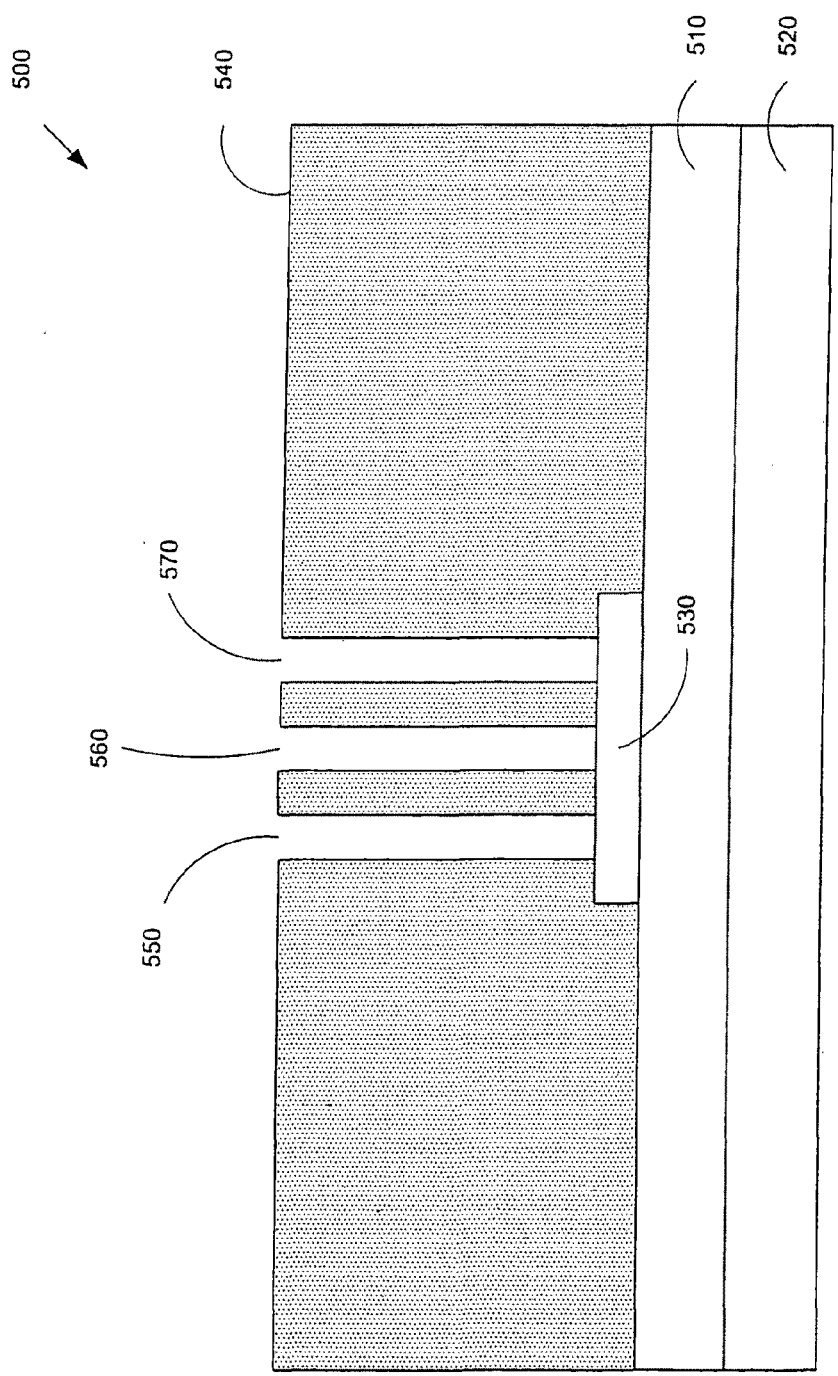
FIG. 5 illustrates a first stage of construction of an alternate advantageous embodiment of an integrated circuit chip of the present invention.

FIG. 5 illustrates a first stage of construction of an alternate advantageous embodiment of an integrated circuit chip 500 of the present invention. Active circuit area 510 of integrated circuit chip 500 is fabricated on a base substrate 520. An associated metal pad 530 is also fabricated as shown in FIG. 5. Then active circuit area 510 and metal pad 530 are covered with passivation layer 540. For clarity passivation layer 540 in FIG. 5 is shown as a single layer. Passivation layer 540 may actually comprise a number of layers as in the case of integrated circuit chip 200 and integrated circuit chip 300.

Vias 550, 560 and 570 are etched through passivation layer 540 using a conventional etch process. Vias 550, 560 and 570 extend through passivation layer 540 to metal pad 530. For clarity FIG. 5 is not drawn to scale. The vertical dimension is exaggerated so that the height of the elements of integrated circuit chip 500 (and the height of vias 550, 560 and 570) appears to be greater than normal with respect to the horizontal dimension.

Figure 6:
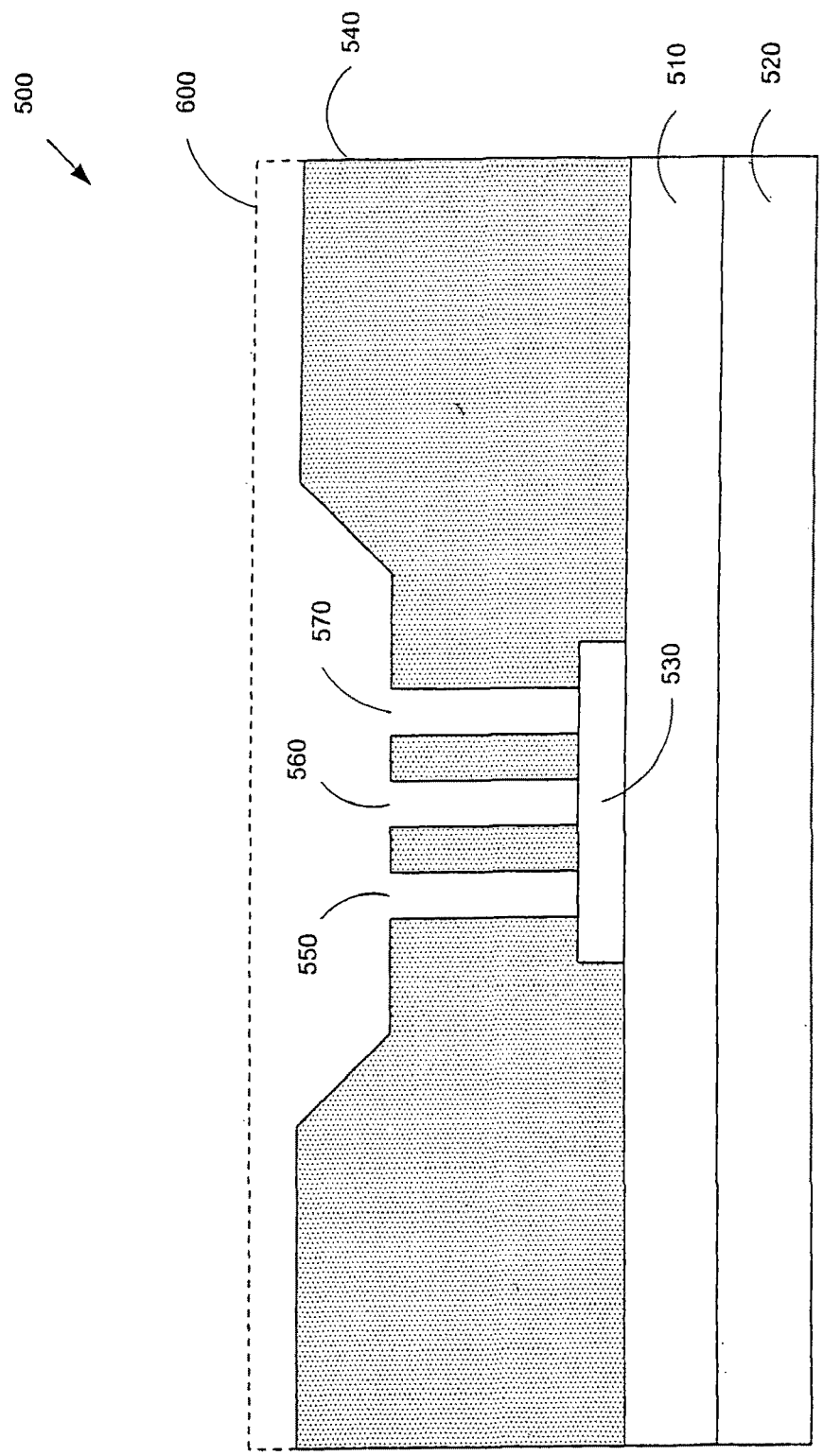
FIG. 6 illustrates a second stage of construction of an alternate advantageous embodiment of an integrated circuit chip of the present invention.

FIG. 6 illustrates a second stage of construction of an alternate advantageous embodiment 500 of an integrated circuit chip 500 of the present invention. After vias 550, 560 and 570 have been etched through the body of passivation layer 540, the surface of passivation layer 540 is etched to form a pattern for a redistribution metal layer. As shown in FIG. 6, portions of the surface of passivation layer 540 may be removed to form topological features such as a trench. The trench shown in FIG. 6 is located at the point where vias 550, 560 and 570 extend through passivation layer 540. This particular location for the trench is merely an example. Other topological features of a redistribution metal layer may be etched in passivation layer 540 at other locations. Dotted line 600 in FIG. 6 shows the location of the original surface of passivation layer 540 before portions of passivation layer 540 were removed.

Figure 7:
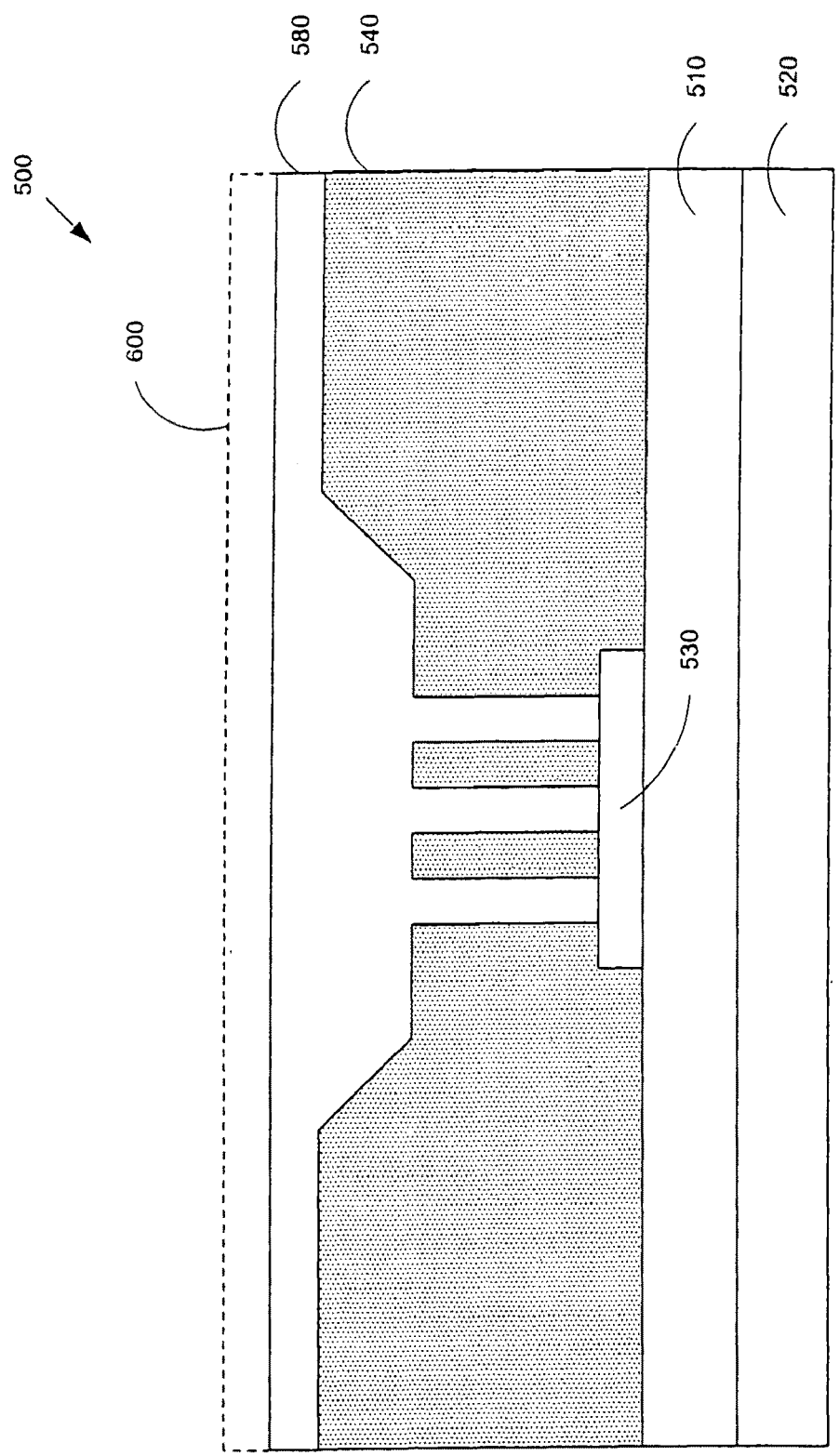
FIG. 7 illustrates a third stage of construction of an alternate advantageous embodiment of an integrated circuit chip of the present invention.

FIG. 7 illustrates a third stage of construction of an alternate advantageous embodiment of an integrated circuit chip 500 of the present invention. Redistribution metal layer 580 is formed on the surface of integrated circuit chip 500 by depositing metal into the trench patterns etched in passivation layer 540. In one advantageous embodiment the metal in redistribution metal layer 580 is aluminum. In another advantageous embodiment the metal in redistribution metal layer 580 is tungsten. Other types of metals may also be used.

When metal is deposited onto the trench pattern etched into the surface of passivation layer 540, a portion of the metal fills vias 550, 560 and 570. The vias 550, 560 and 570 are completely filled with metal. This ensures that there is an electrical contact between metal pad 530 and redistribution metal layer 580. Metal may be deposited into vias having an aspect ratio as much as one to twenty (1:20). That is, metal may completely fill a via that is twenty times longer than it is wide.

The vias 550, 560 and 570 are simultaneously filled with metal during the metal deposition process that fills the trench pattern etched into passivation layer 540. This fact is very important because it combines two steps into a single step. This eliminates the trouble and expense of an additional process step. In particular, in this advantageous embodiment of the invention, there is no need to fill vias 550, 560 and 570 with metal in a first step and then connect the filled vias 550, 560 and 570 with the redistribution metal layer 580 in a second step. The vias 550, 560 and 570 and the redistribution metal layer 580 are simultaneously created as a unitary structure.

After redistribution metal layer 580 has been formed within the metal pattern etched into passivation layer 540, a chemical mechanical polishing (CMP) process is applied to the surface of redistribution metal layer 580. The CMP process produces a flat polished metal surface that is suitable for receiving a solder bump or other interface layers that are compatible with solder.

Dotted line 600 in FIG. 7 shows the location of the original surface of passivation layer 540 before portions of passivation layer 540 were removed. In the embodiment of the invention shown in FIG. 7 the surface of the redistribution metal layer 580 is lower than the original surface of passivation layer 540 that existed before portions of passivation layer 540 were removed.

Figure 8:
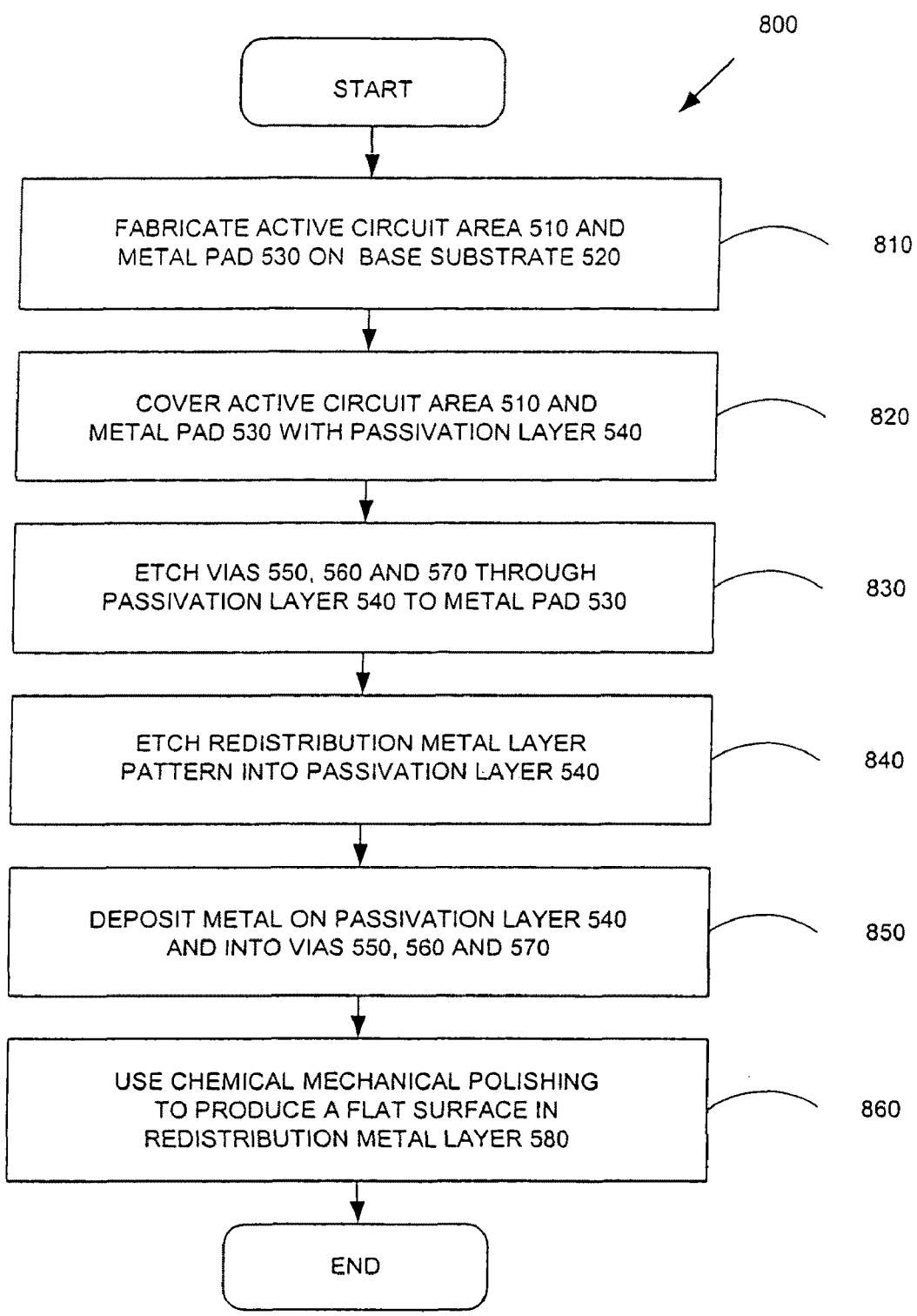
FIG. 8 illustrates a flow chart of an advantageous embodiment of a method of the present invention for providing a redistribution metal layer in an integrated circuit chip.

FIG. 8 illustrates a flow chart of an advantageous embodiment of a method of the present invention for providing a redistribution metal layer in an integrated circuit chip. The steps of the method are generally denoted with reference numeral 800.

The first step is to fabricate an active circuit area 510 and an associated metal pad 530 on a base substrate 520 (step 810). The next step is to cover active circuit area 510 and metal pad 530 with passivation layer 540 (step 820). Then vias 550, 560 and 570 are etched through passivation layer 540 to metal pad 530 (step 830).

Then a metal pattern for the redistribution metal layer is etched into passivation layer (step 840). The next step is to deposit metal over the metal pattern in passivation layer 540. As previously described, the metal simultaneously fills vias 550, 560 and 570 (step 850). Lastly, a chemical mechanical polishing (CMP) process is applied to produce a flat polished surface in redistribution metal layer 580.

During the fabrication of an integrated circuit chip several layers of metal may be used to fashion the active circuitry area of the chip. For example, integrated circuit chip 200 has an active circuit area 210 comprising layers of three metals (represented by the letters M1, M2 and M3) on a base substrate 220. Integrated circuit chip 300 has the same structure.

In an advantageous embodiment of the present invention, the last metal layer used to fabricate an active circuit area may also be used to fabricate the redistribution metal layer in the integrated circuit chip. For example, if there are five (5) metal layers used to fabricate an active circuit area, then the fifth metal layer may also be used to fabricate the redistribution metal layer. The redistribution metal layer may be connected to the active circuit area through multiple vias instead of through a large metal pad. Manufacturing time and expense can be saved by using a single metal layer to perform the function of a redistribution metal layer and the function of an active circuit. In this advantageous embodiment of the invention there is no need to add a separate metal layer for the redistribution metal layer. There is to need to perform a separate manufacturing step to add the redistribution metal layer.

Figure 9:
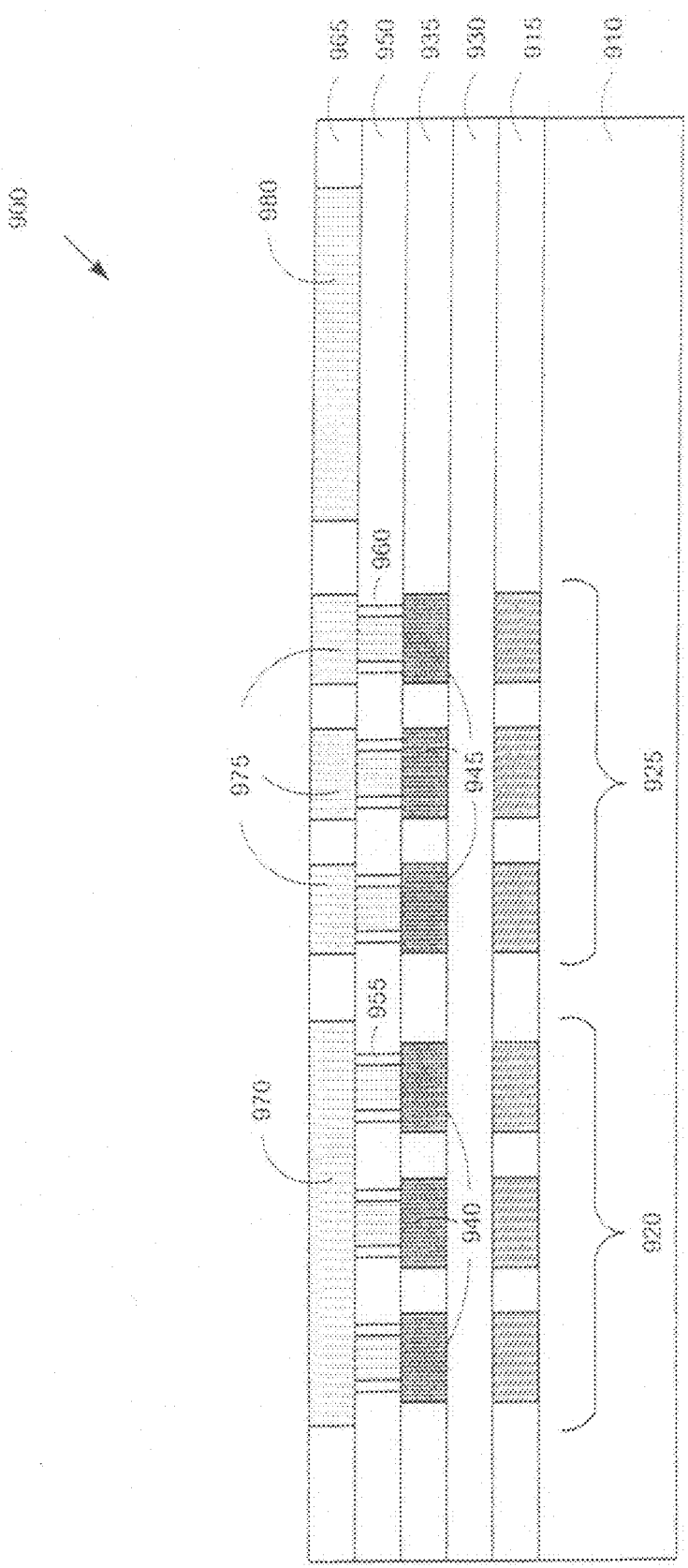
FIG. 9 illustrates an advantageous embodiment of an integrated circuit chip of the present invention showing how a last metal layer of the integrated circuit chip may be used to fabricate a bump pad for a solder bump.

FIG. 9 illustrates an advantageous embodiment of an integrated circuit chip 900 of the present invention. Active circuit area 920 and active circuit area 925 are placed on base substrate 910. Active circuit area 920 and active circuit area 925 are made up of a first metal layer. Substrate layer 915 and substrate layer 930 are then applied to cover the first metal layer of active circuit area 920 and active circuit area 925.

An active circuit area 940 and an active circuit area 945 are then placed on substrate 930. Active circuit area 940 and active circuit area 945 are made up of a second metal layer. Substrate layer 935 and substrate layer 950 are then applied to cover the second metal layer of active circuit area 940 and active circuit area 945.

Vias to active circuit area 940 (collectively designated with reference numeral 955) and vias 960 to active circuit area 945 (collectively designated with reference numeral 960) are etched in substrate layer 950 and filled with a third metal layer. As shown in FIG. 9, the third metal layer within vias 955 is coupled to a bump pad 970 in top substrate layer 965. Bump pad 970 is also made of the third metal layer.

The third metal layer within vias 960 is coupled to individual active circuit elements 975 on top substrate layer 965. The individual active circuit elements 975 are also made of the third metal layer. Bump pad 980 on top substrate layer 965 is also made up of the third metal layer. Bump pad 980 may be connected to other active circuit elements (not shown) within integrated circuit 900. The third metal layer in integrated circuit chip 900 is the last metal layer in integrated circuit chip 900.

The last metal layer (here, the third metal layer comprising bump pad 970, individual active circuit elements 975, bump pad 980, vias 955 and vias 960) may be formed using a metal that is different than the metal used in the previous metal layers. The metal in the last metal layer is compatible with solder (e.g., copper, nickel, palladium) in order to receive solder on the solder bumps formed in the last metal layer.

FIG. 9 illustrates how the last metal layer in an integrated circuit may be used to fabricate both active circuit elements and one or more bump pads for solder bumps.

Although the present invention has been described in detail, those skilled in the art will understand that various changes, substitutions, and alterations herein may be made without departing from the spirit and scope of the invention it its broadest form.

What is claimed is:

1. A method for fabricating an integrated circuit comprising:
    fabricating a first portion of an active circuit area and an associated metal pad on a base substrate;
    depositing a passivation layer above the first portion of the active circuit area and above the metal pad, wherein at least portions of an upper surface of the passivation layer is non-planar;
    etching at least one via through the passivation layer to the metal pad;
    etching a metal layer pattern into the passivation layer; and
    depositing a metal layer onto the metal layer pattern in the passivation layer and in the via connected to the metal pad to form a redistribution metal layer, wherein a portion of the redistribution metal layer forms a solder bump pad.

2. The method as claimed in claim 1 further comprising:
    polishing a surface of the redistribution metal layer to produce a flat surface on the redistribution metal layer.

3. The method as claimed in claim 1 further comprising:
    depositing the metal layer into at least one via to electrically connect the metal pad to the solder bump pad portion of the redistribution metal layer.

4. A method for fabricating an integrated circuit, comprising:
    forming at least one active circuit area within the integrate circuit;
    forming an insulating layer having a contact opening to an active circuit element and a variable and non-planar upper surface between the contact opening and a solder bump contact region laterally spaced apart from the contact opening; and
    forming a redistribution metal layer in the integrated circuit over and conformal to the variable and non-planar upper surface, the redistribution metal layer coupling the active circuit element to the solder bump contact region.

5. The method of claim 4, wherein portions of the redistribution metal layer in the solder bump contact region are left open by overlying material to receive a solder bump.

6. The method of claim 4, wherein the portions of the redistribution metal layer in the integrated circuit that are open to receive a solder bump include at least one flat surface, the method further comprising:
    attaching a solder bump to the flat surface of the redistribution metal layer.

7. The method of claim 4, further comprising:
attaching a solder bump to the portions of the redistribution metal layer of the integrated circuit that are open to receive a solder bump.

8. The method of claim 4, further comprising:
forming the at least one active circuit area and an associated metal pad on a base substrate;
forming a silicon oxide layer above the at least one active circuit area and above the metal pad;
forming a phosphosilicate glass layer above the silicon oxide layer;
forming the redistribution metal layer above the phosphosilicate glass layer, wherein the redistribution metal layer is electrically connected to the metal pad; and
forming a silicon oxynitride layer over portions of the redistribution metal layer.

9. The method of claim 8, wherein portions of the redistribution metal layer are open to receive a solder bump.

10. The method of claim 8, further comprising:
forming openings through the silicon oxynitride layer deposited above the redistribution metal layer etched to a pattern that leaves portions of the redistribution metal layer uncovered to receive a solder bump.

11. The method of claim 8, further comprising:
forming a polyimide layer above portions of the redistribution metal layer and above portions of the silicon oxynitride layer,
wherein portions of the redistribution metal layer are open to receive a solder bump.

12. The method of claim 8, further comprising:
attaching a solder bump to the portions of the flat redistribution metal layer of the integrated circuit that are open to receive a solder bump.

13. The method of claim 4, wherein the redistribution metal layer is above all other metal layers within an active circuit area of the integrated circuit except any solder bumps.

14. The method of claim 4, further comprising:
forming a silicon oxynitride layer above the redistribution metal layer; and
forming a polyimide layer above the silicon oxynitride layer.

15. The method of claim 14, further comprising:
etching an opening through the silicon oxynitride layer and the polyimide layer.

16. A method for fabricating an integrated circuit, comprising:
forming at least one active circuit area within the integrate circuit;
forming a passivation layer above the at least one active circuit area, the passivation layer having a contact opening to an active circuit element and a solder bump contact region laterally spaced apart from the contact opening, the passivation layer having a variable and non-planar upper surface within at least a portion of the region between the contact opening and the solder bump contact region; and
forming a redistribution metal layer in the integrated circuit over and conformal to an upper surface of the passivation layer, the redistribution metal layer coupling the active circuit element to the solder bump contact region.

17. The method of claim 16, wherein portions of the redistribution metal layer in the solder bump contact region are left open by overlying material to receive the solder bump.

18. The method of claim 16, wherein the portions of the redistribution metal layer in the integrated circuit that are open to receive a solder bump include at least one flat surface, the method further comprising:
attaching a solder bump to the flat surface of the redistribution metal layer.

19. The method of claim 16, further comprising:
attaching a solder bump to the portions of the redistribution metal layer of the integrated circuit that are open to receive a solder bump.

20. The method of claim 16, further comprising:
forming the at least one active circuit area and an associated metal pad on a base substrate;
forming a silicon oxide layer above the active circuit area and above the metal pad;
forming a phosphosilicate glass layer above the silicon oxide layer;
forming the redistribution metal layer above the phosphosilicate glass layer, wherein the redistribution metal layer is electrically connected to the metal pad; and
forming a silicon oxynitride layer above portions of the redistribution metal layer.

* * * * *